United States Patent
Sakagami et al.

[11] Patent Number: 5,838,041
[45] Date of Patent: Nov. 17, 1998

[54] NONVOLATILE SEMICONDUCTOR MEMORY DEVICE HAVING MEMORY CELL TRANSISTOR PROVIDED WITH OFFSET REGION ACTING AS A CHARGE CARRIER INJECTING REGION

[75] Inventors: Eiji Sakagami, Yokohama; Kiyomi Naruke, Ebina, both of Japan

[73] Assignee: Kabushiki Kaisha Toshiba, Japan

[21] Appl. No.: 720,618

[22] Filed: Oct. 2, 1996

[30]    Foreign Application Priority Data

Oct. 2, 1995  [JP]  Japan .................................... 7-254782
  Mar. 18, 1996 [JP]  Japan .................................... 8-060621

[51] Int. Cl.⁶ ................................................. H01L 29/792
[52] U.S. Cl. ........................................... 257/324; 257/326
[58] Field of Search .................................... 257/315, 316, 257/324, 311, 322, 321, 326; 365/185.01

[56]                References Cited

U.S. PATENT DOCUMENTS

| | | | |
|---|---|---|---|
| 4,870,470 | 9/1989 | Bass, Jr. et al. ........................ | 257/324 |
| 5,337,274 | 8/1994 | Ohji ....................................... | 257/315 |
| 5,408,115 | 4/1995 | Chang .................................... | 257/324 |
| 5,424,979 | 6/1995 | Morii ..................................... | 257/315 |
| 5,463,579 | 10/1995 | Shimoji .............................. | 365/185.01 |
| 5,496,753 | 3/1996 | Sakurai et al. ......................... | 257/324 |
| 5,585,293 | 12/1996 | Sharma et al. ............................. | 437/43 |
| 5,604,696 | 2/1997 | Takaishi ................................ | 257/311 |

OTHER PUBLICATIONS

Seiji Yamada et al., 1991 IEEE, "A Self–Convergence Erasing Scheme For A Simple Stacked Gate Flash EEPROM", pp. 91–307 to 91–310.

N. Matsukawa et al., "A Hot Carrier Indeed Low–Level Leakage Current in thin Silicon Dioxide Films", 1995 IEEE, pp. 162–167.

*Primary Examiner*—Sara W. Crane
*Attorney, Agent, or Firm*—Banner & Witcoff

[57]                ABSTRACT

The present invention discloses a nonvolatile semiconductor memory device having a memory cell transistor in which an offset region is provided as a charge carrier injecting region. An insulating film and a gate electrode is formed in order of mention on a semiconductor substrate. Source/drain regions are formed on the surface of the semiconductor substrate with the gate electrode interposed therebetween. The drain has an LDD (Lightly Doped Drain) structure. Furthermore, a layered film of silicon oxide films and a SiN film is provided on a channel region between an edge of the gate electrode and a source diffusion layer. To be more specific, the layered film is formed in such a way that the SiN film is interposed between the silicon oxide films, constituting a side wall of the gate electrode. The SiN film is a charge carrier accumulating layer. Contact holes are formed in an insulating film between layers, respectively reaching the source and drain regions. Each of the contact holes are filled with a conductive material (contact plug). A conductive barrier film (diffusion protecting film) is provided on the bottom and to the inner wall portions of the contact hole. The contact plugs respectively connect the source and the drain to upper layer, aluminium wiring.

28 Claims, 7 Drawing Sheets

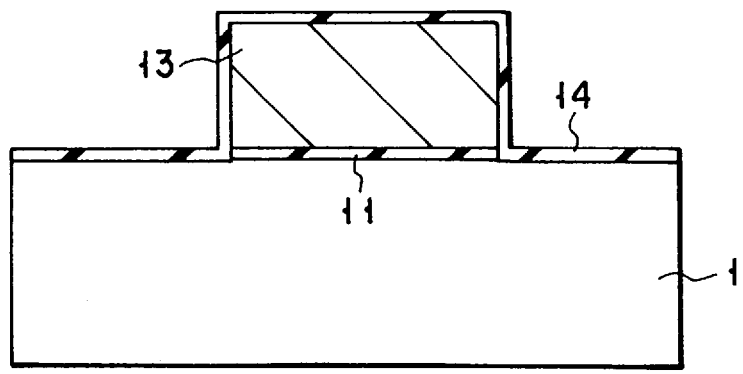
F I G. 4
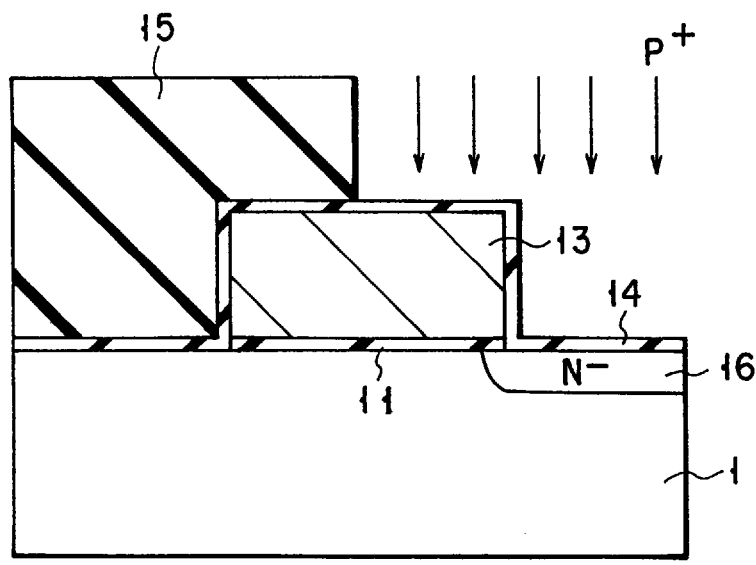
F I G. 5
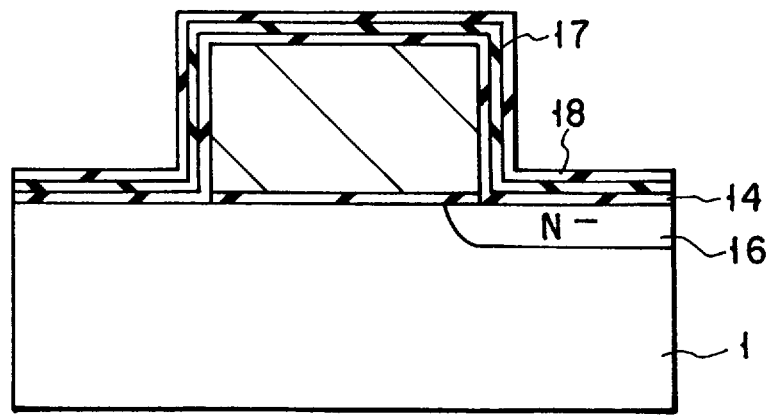
F I G. 6

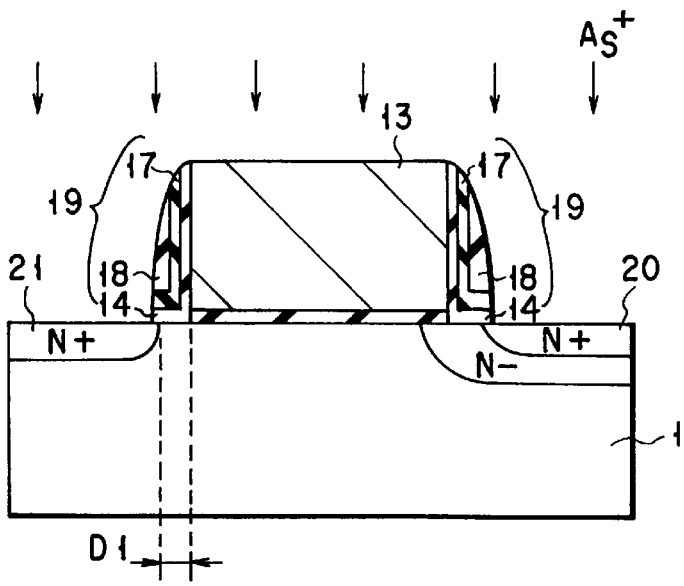
F I G. 7
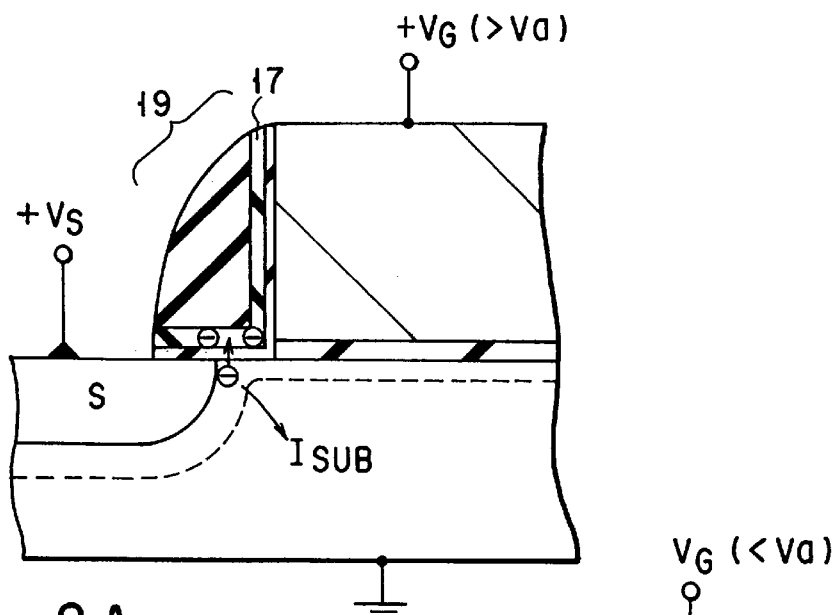
F I G. 8A
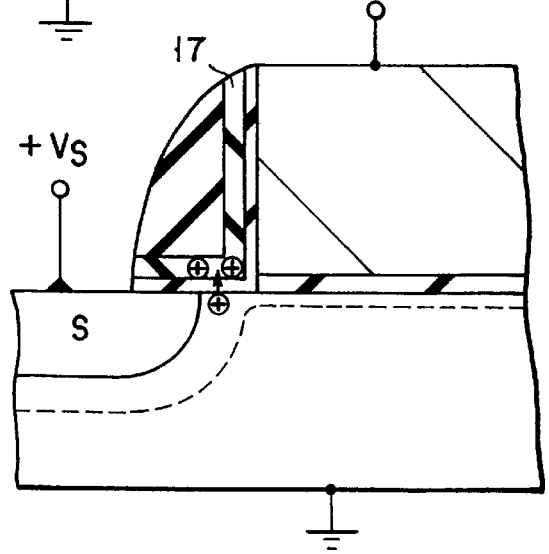
F I G. 8B

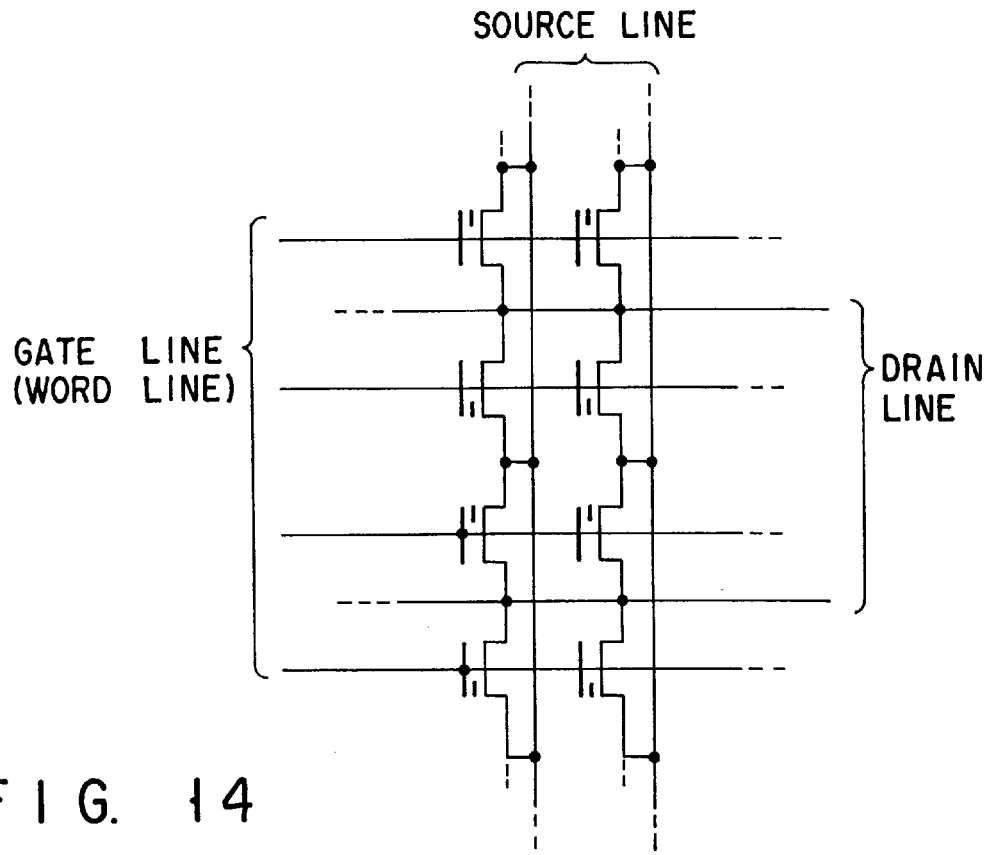
F I G. 14
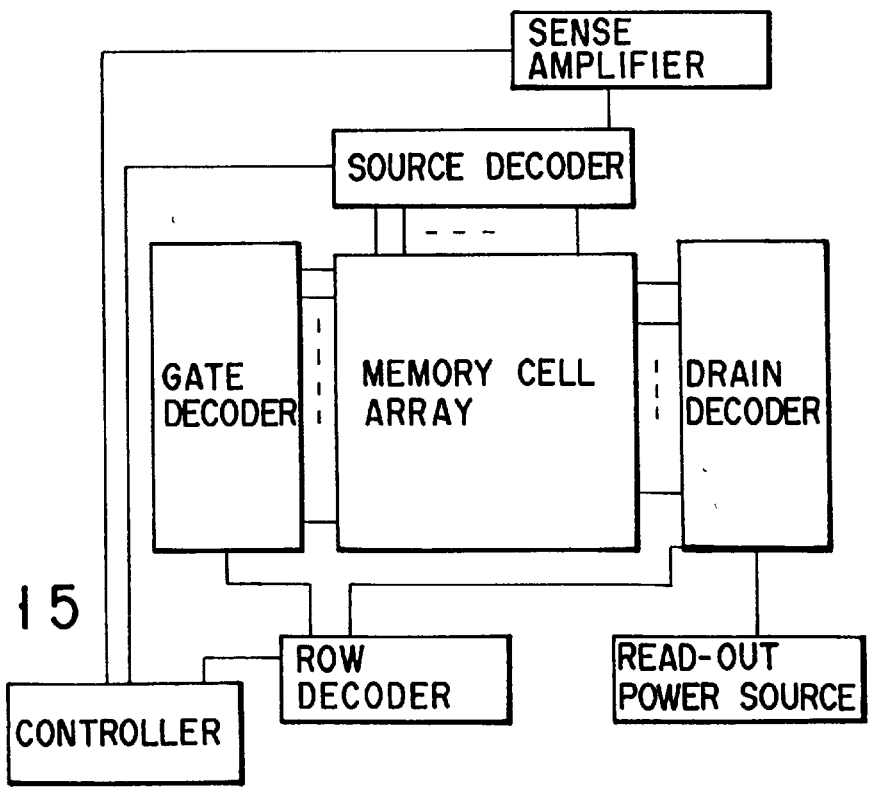
F I G. 15

NONVOLATILE SEMICONDUCTOR MEMORY DEVICE HAVING MEMORY CELL TRANSISTOR PROVIDED WITH OFFSET REGION ACTING AS A CHARGE CARRIER INJECTING REGION

BACKGROUND OF THE INVENTION

1. Field of the Invention

The present invention relates to a nonvolatile semiconductor memory device capable of performing data-write, erase, and read-out operations.

2. Description of the Related Art

In recent years, memory cells having an MONOS (Metal-Oxide-Nitride-Oxide-Silicon) structure have drawn attention to be used as memory cells in electrically programmable and erasable nonvolatile memories (flash EEPROM).

FIG. 1 is a cross-sectional view of a memory cell having an MONOS structure. Reference numeral 1 indicates a substrate or a well (P-type impurity region). Reference numerals 2 and 3 denote a drain (N-type impurity rich region) and a source (N-type impurity rich region), respectively. Reference numerals 4, 5, and 6 are a silicon oxide film, a silicon nitride (SiN) film, and a silicon oxide film, respectively. Furthermore, reference numeral 7 indicates a control gate, and numeral 9 an oxide film formed after the films 4, 5 and 6 and the gate 7 are processed.

In the memory cell thus constructed, charge carriers are injected into the SiN film 5 serving as a gate insulating film. The SiN film 5 has a charge carrier trapping center. The threshold voltage of the cell can be controlled by trapping charge carriers in the charge carrier trapping center of the SiN film 5 and by removing the charge carriers thus trapped from the SiN film 5.

It is proposed that in the nonvolatile memory device employing the MONOS type memory cells, the write, erase, and read-out operations are achieved in the following ways. The "write" used herein means "injecting charge carriers into the SiN film". The "erase" means "removing charge carriers from the SiN film".

Representative writing methods are as follows:

(1) channel hot electrons are generated in a channel region 8 near the drain 2 and the electrons thus generated are injected into the SiN film.

(2) a high electric field is applied between the control gate 7 and any one of the drain 2, channel region 8, and source 3, and electrons are injected into the SiN film 5 by means of an FN (Fowler-Nordheim) tunneling.

In contrast, erase is achieved typically by applying a high electric field between the control gate 7 and any one of the source 3, drain 2, and channel region 8, thereby moving electrons from the SiN film toward a substrate in the form of a tunnel current.

In the MONOS type cells where write/erase is performed by means of the FN tunneling in a source or a drain region, a high electric field must be applied to the charge injecting region of the gate insulating film. If an impurity concentration is low in the surface of the source or drain region present under the gate insulating film, a depletion region will develop under the gate insulating film to which a high electric field is to be applied. As a result, no sufficiently high electric field will be generated. If the distance between the gate electrode and source or drain region is long, a sufficiently high electric field will not be obtained, either. In the case where the electric field is not sufficiently high as mentioned above, a satisfactory large FN current will not be generated. Consequently, the write/erase will not be performed successfully.

Therefore, when write/erase is performed by the FN tunneling of charge carriers in the source or drain region, a sufficiently large overlap region must be provided between the source or drain region (diffusion layer) and the gate electrode, and the impurity concentration of the source or drain region under the gate electrode must be maintained high.

In the case where write is executed by use of channel hot electrons (CHE), the impurity concentration of the drain under the gate electrode must be maintained high enough not to decrease the efficiency of hot electron injection, in the same way as in the case where write is executed by the FN tunneling.

As the result that impurities must be contained in a large amount in the source or drain region, as mentioned above, the source or drain region becomes deep. The deep source or drain region makes it difficult to reduce the size of a cell transistor. If charge carriers are injected by the FN tunneling, a high electric field is generated, so that the energy of the charge carriers passing through the insulating film will be increased. Consequently, the insulating properties of the insulating film are degraded and the charge carriers trapped in the insulating film increases in amount. These results will lower a data-rewrite ability and data-storage ability of the nonvolatile memory.

In the case where an NOR-type memory cell array is formed without using select transistors, an unfavorable phenomenon of data disturbance will occur in an unselected cell sharing the same bit line and word line with a selected cell, during write/erase operation.

When write is performed in the MONOS cell transistor, for example, by injecting electrons, which are ascribed to channel hot electrons, into the drain region side of an ONO (Oxide-Nitride-Oxide) insulating film, a high potential stress (a stress electric field) is continuously applied to the drain of a writing-completed cell until data is completely written into all cells sharing the same bit line. Since the stress electric field is applied in the direction, from the ONO insulating film to the drain, the electrons are removed in this direction. If many electrons are removed by application of the stress electric field, data inversion, that is, the destruction of memory data, will take place in some cells when data is completely written into all cells sharing the same bit line.

When a matrix-type cell array is formed by the word lines and the bit lines in the MONOS type cells employing the FN tunneling for write/erase in the channel region, a select transistor is required to prevent write errors. Hence, when a memory cell array of the NOR type is formed, a select transistor must be provided per memory cell. For this reason, the NOR type memory cells do not contribute to a dimensional reduction of the memory cell structure.

When an NAND type memory cell array is formed, two transistors are required for a series of the NAND logic structure (a serial array construction of a plurality of cells), which is fewer transistors than required in the NOR type. However, it will be rather complicated to control the threshold voltage during a write operation and to control the electric potential applied to unselected cells adjacent to the selected cell, in order to prevent write errors. Consequently, a problem is raised in that the control circuit is inevitably large.

SUMMARY OF THE INVENTION

The object of the present invention is to provide a nonvolatile semiconductor memory having highly reliable memory cells with no select transistors, which is therefore capable of reducing the size. The object of the present invention can be achieved by the following constructions:

The nonvolatile semiconductor memory device comprising:

a semiconductor substrate of a first conductive type;

a first and a second diffusion layer of a second conductive type, formed in the semiconductor substrate;

a gate electrode provided on the area extending from a part of a channel region present between the first and the second diffusion layer to a part of the first diffusion layer;

a first insulating film between the gate electrode and the semiconductor substrate; and a second insulating film comprising at least two-layered film different in film type, formed on the channel region present between the gate electrode and the second diffusion layer, a part of the second insulating film being a charge carrier accumulating layer Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3 to 7 are cross sectional views showing the manufacturing steps of the nonvolatile memory cell according to a first embodiment of the present invention, in order of manufacturing.

FIGS. 8A and 8B are cross sectional views for explaining the operations of the nonvolatile memory cells according to a first embodiment of the present invention;

FIG. 14 is a circuit diagram showing a memory cell array of the nonvolatile semiconductor memory device according to the present invention, in which a charge carrier injecting region is provided on a source side;

FIG. 15 is a circuit block diagram of the nonvolatile semiconductor memory device of the present invention;

DETAILED DESCRIPTION OF THE PREFERRED EMBODIMENTS

Figure 1:
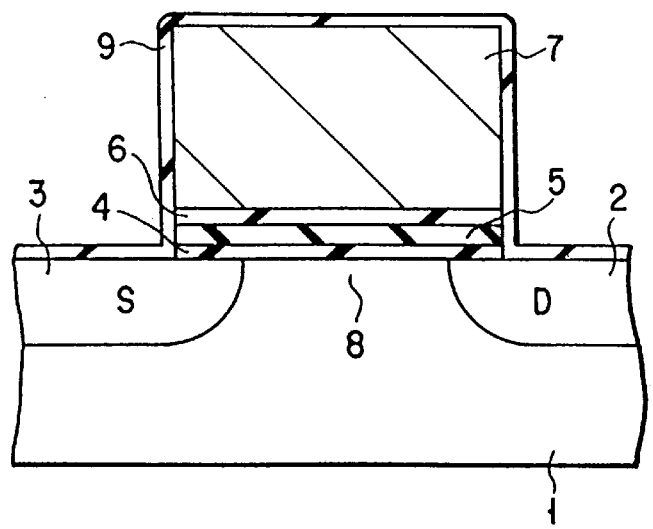
FIG. 1 is a cross sectional view of a MONOS type memory cell.
Figure 2:
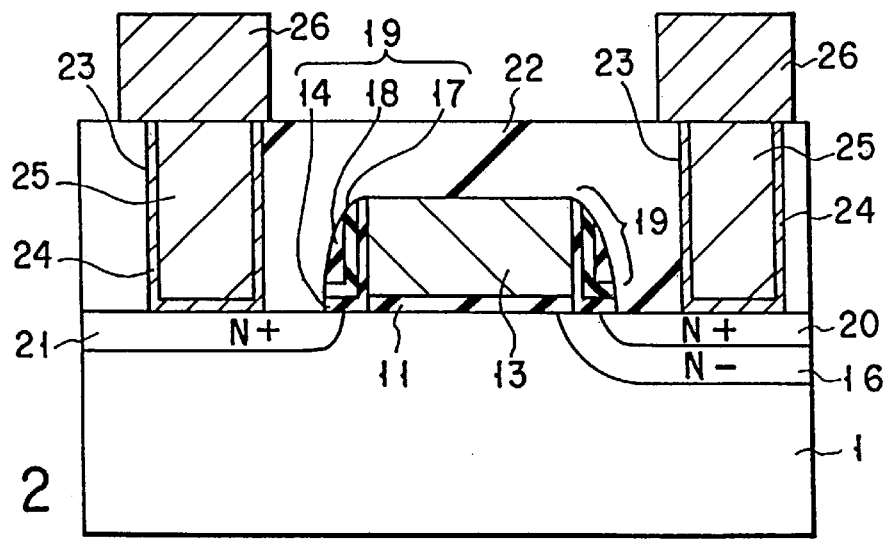
FIG. 2 is a cross sectional view of a nonvolatile memory cell according to a first embodiment of the present invention.

FIG. 2 is a cross sectional view of the nonvolatile memory cell according to a first embodiment of the present invention. On a semiconductor substrate 11 a gate electrode (control gate) 13 is formed. Under the gate electrode 13, formed is an insulating layer 11 made of a silicon oxide film. On the surface of the semiconductor substrate 1, source/drain regions are formed with the gate electrode 13 interposed therebetween. A diffusion layer 21 is a source in which an off-set region is provided. Diffusion layers 16 and 20 are lightly doped drain structure. On the channel region between an edge of the gate electrode 13 and the diffusion layer 21, a layered film consisting of silicon oxide films 14 and a SiN film 17 is provided. To be more specific, the layered film is formed in such a way that the SiN film 17 is interposed between the silicon oxide films 14 and 18, constituting a side wall 19 of the gate electrode 13. The SiN film 17 is a charge carrier accumulating layer. Each of the diffusion layers 20 and 21 is formed so as to overlap with the neighbor of the lower edge portion of the side wall 19. On the substrate 1 and the gate electrode 13, an insulating film 22 between layers is formed. Contact holes 23 are formed in the insulating film between layers and respectively reach the diffusion layers 20 and 21. Each of the contact holes 23 is filled with a conductive material 25 (contact plug). A conductive barrier metal layer (diffusion preventing film) 24 is provided on the bottom and to inner side wall portions of the contact holes. The contact plugs 25 connect an upper layer, namely, Al wiring 26 to the source (diffusion layer 21) and to the drain (diffusion layer 20), respectively.

Figure 3:
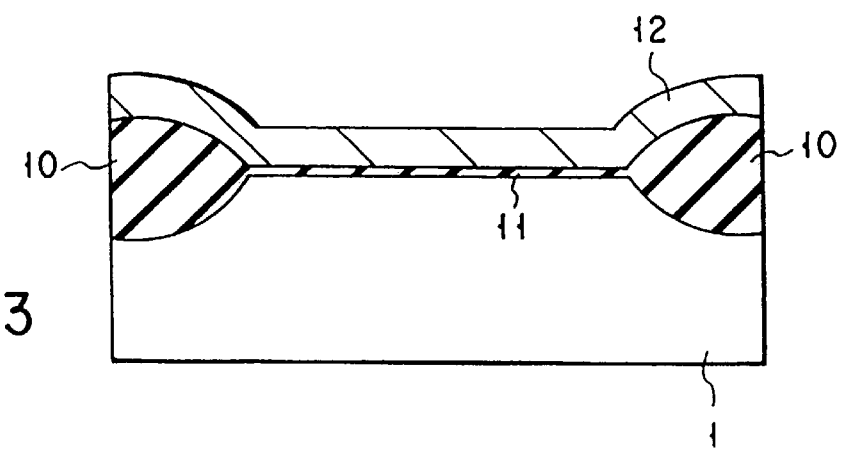

FIGS. 3 to 7 are cross sectional views showing the manufacturing steps of the nonvolatile memory cell according to a first embodiment of the present invention, in a stepwise manner. As shown in FIG. 3, on the silicon substrate 1, a predetermined element isolation area 10 (oxide film) is formed by a commonly-known technique. Thereafter, on a memory cell region on the silicon substrate 1, surrounded by the element isolation area 10, a silicon oxide film 11 is formed as a first insulating film. The first insulating film 11 is formed by oxidation of a silicon substrate or by deposition of a silicon oxide film.

Subsequently, on the first insulating film 11 (silicon oxide film), polysilicon 12 is formed in a thickness of 100–200 nm. Then, an N-type impurity such as arsenic or phosphorus is doped in a concentration of about $2\times10^{20}$ to $4\times10^{20}$ cm$^{-3}$ by use of a commonly-known technique. In the case where the resistance of the gate electrode is reduced, a silicide layer formed of a metal, such as WSi or MoSi, having a high melting point may be deposited on the polysilicon 12, to form a polyside structure, or a metal having a high melting point such as W may be deposited on the polysilicon 12, to form a polymetal structure.

As a next step, the polysilicon 12 is subjected to patterning, as shown in FIG. 4. The polysilicon 12 serving as a control gate of the memory cell is patterned to form a gate electrode (control gate) 13. Thereafter, an oxide film 14 is formed on the resultant structure by oxidation of silicon or the deposition of a silicon oxide film. The oxide film 14 should have a thickness less than 10 nm to obtain a sufficiently strong electric field to the charge injecting region and to facilitate tunneling to the charge carrier accumulating layer formed later. The lowermost thickness of the oxide film 14 may be better to set to a value larger than 2 nm, in order to suppress back-tunneling, a reverse flow of injected charge carriers. Before the oxide film 14 is formed, predetermined impurities may be introduced into the substrate 1 by a commonly known technique such as ion implantation, in order to control the threshold voltage of the channel of the charge carrier injecting region.

Next, an off-set region of a cell transistor is formed on the source side, as shown in FIG. 5. To be more specific, the off-set region is formed by introducing N-type impurities into the substrate 1 by a commonly-known technique such as ion implantation, while the source region is being masked with, for example, a photoresist 15 or the like. As a result, an N-type diffusion layer 16 is formed in the drain side. If the amount (dose) of the ions injected into the drain side is set to, for example, $5 \times 10^{12}$ to $5 \times 10^{14}$ cm$^{-2}$, the resultant N-type diffusion layer 16 will be a lightly doped drain (LDD).

Subsequently, an SiN film 17 serving as a charge carrier accumulating layer is deposited on the resultant structure, as shown in FIG. 6. The SiN film 17 is formed in a thickness less than 7 nm in order to intensify the electric field in the charge carrier accumulating region. The lowermost film thickness of the SiN film 17, which is principally determined by a charge-trap density, is preferred to be larger than 0.5 nm.

Thereafter, a silicon oxide film 18 is deposited on the SiN film 17 by a commonly-known technique such as a CVD method. The thickness of the silicon oxide film 18 should be larger than 2 nm and smaller than 10 nm.

Then, a side wall 19 of the gate 13 is formed by etch-back or the like, as shown in FIG. 7. The film thickness of the side wall 19 thus formed, that is, a layered ONO film consisting of oxide film 14—SiN film 17—Oxide film 18, should not exceed 30 nm.

Afterward, the N-type diffusion layer 20 serving as a drain and N-type diffusion layer 21 serving as a source are formed by introducing N-type impurities by a commonly known technique such as ion implantation. The width of the gate side wall 19 restricts the width of the charge carrier injecting region. The oxide film 18 deposited on the SiN film prevents outdiffusion of the charge carriers accumulated in the SiN film. In this manner, the data storage performance of the cells can be improved by the oxide film 18.

The N-type diffusion layers 20 and 21 serving as a drain and a source, which are formed by implanting ions in an amount of, for example, $5 \times 10^{14} - 1 \times 10^{16}$ cm$^{-2}$, are layers relatively rich in N-type impurities. The distance D1 between the gate electrode (control electrode) 13 and an end portion of the diffusion layer 21 serving as a source is determined so as to obtain a sufficiently-high electric field at which hot carriers generated during the charge carrier injection can reach the charge carrier accumulating layer (SiN film 17). The distance D1 is, for example, shorter than 25 nm. The distance D1 can be controlled by the width of the side wall 19 of the gate and by a thermal diffusion step performed after ions are implanted into the source. Alternatively, the distance D1 can be controlled by the dielectric constant of the film to be used in the gate side wall 19.

Although the SiN film (17) is used as a charge carrier accumulating layer in the aforementioned embodiment, any film can be used as long as it has a sufficiently high charge carrier trapping ability, relative dielectric constant and dielectric strength and is not qualitatively degraded by a thermal processing. Examples of the SiN film include tantalum oxide, strontium titanate, barium strontium titanate, and PZT (pb(lead) zirconate titanate) films.

Thereafter, as shown in FIG. 2, an insulating film 22 between layers is formed and then openings, namely, contact holes 23 are partly formed in the insulating film 22 between layers present right on the source/drain regions in accordance with a commonly-used MOS integrated circuit manufacturing method. After a barrier film is provided on the bottom and to the inner side wall portions by a commonly-known method, a contact plug 25 made of W (tungsten) is formed. When an Al electrode 26 is formed thereon, a memory cell is finally accomplished.

As is explained in the above, the present invention is characterized in that an off-set region (distance D1) formed of an ONO insulating film is provided between the gate electrode and the diffusion layer in the channel region under an edge portion of the gate of the memory cell. Write is performed by injecting charge carriers into the SiN film of the ONO insulating film and trapping the charge carriers in a charge carrier trap center in the SiN film. Erase is achieved by removing the trapped charge carriers from the SiN film or by injecting charge carriers having an opposite polarity (either positively charged or negatively charged carriers) to the trapped charge carriers. Since the channel resistance is altered by the presence or absence of charge carriers or by the polarity of the charge carriers present in the ONO insulating film, the current flowing through the cells changes. This phenomenon is advantageously used in the memory function in the present invention.

In the present invention, as the charge carriers injected into an insulating film (SiN film, etc.), use is made of hot carriers or avalanche hot carriers generated by band-to-band tunneling in a drain or source acting as an injecting electrode. In this case, as the charge carriers injected into the insulating film, either electrons or holes may be chosen by controlling a gate potential. The energy of the hot carrier generated during the charge carrier injection is low, compared to that of the hot carriers generated by the FN current flow. Consequently, the damage to the insulating film can be reduced, improving the reliability of the memory cells. In the memory cells of the present invention, it is not necessary to form a a heavily doped diffusion layer in the source or drain serving as a charge carrier injection electrode, compared to the diffusion layer of the MONOS cells executing write/erase in the channel region. In short, the diffusion layer is not necessary to be formed deep. This feature can contribute to a smaller geometry of cell transistors.

Figure 17:
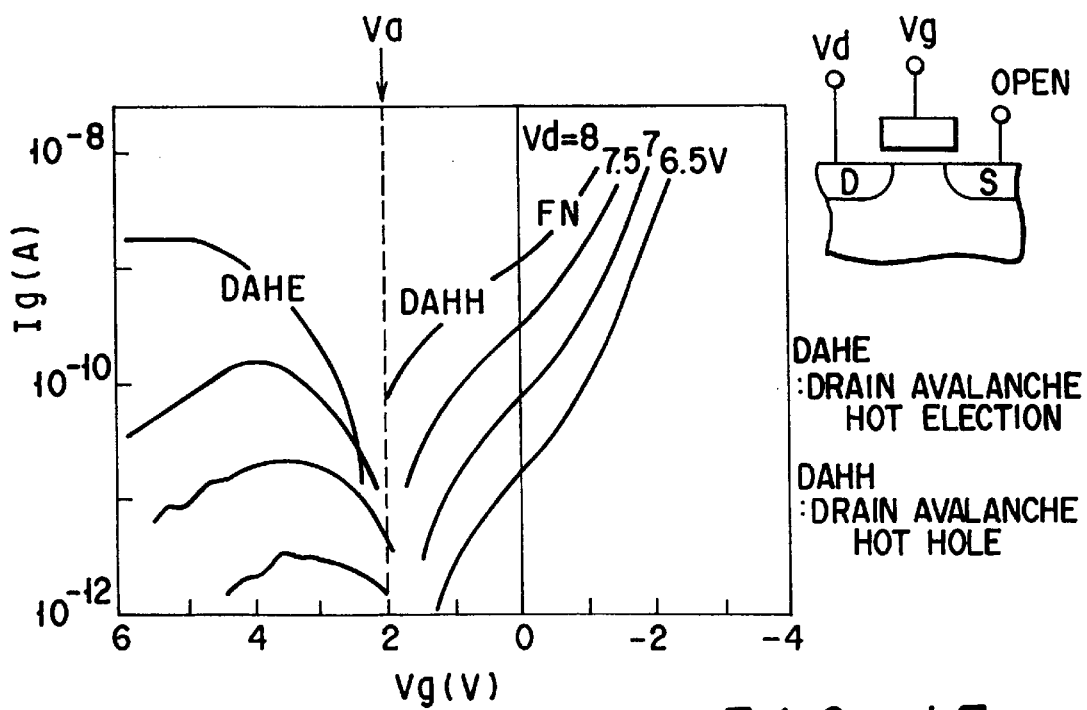
FIG. 17 shows characteristic curves of the drain-gate currents versus gate potential (Vg) in the present invention.

Referring to FIGS. 8A and 8B together with FIG. 17, we will now explain the nonvolatile memory cells according to a first embodiment of the present invention. FIG. 17 shows characteristic curves of the drain-gate current versus gate potential (Vg). In the case where the charge carrier injection region is provided on the source side, write is performed as follows: at first, a positive potential (+Vs) is applied to the source with the drain open. When the electric field exceeds 7 MV/cm in the substrate region near an end of the source diffusion layer, avalanche hot carriers are generated remarkably. As depicted in FIG. 17, if the gate potential (Vg) is set to an appropriate value in the positive direction of certain potential Va (at which neither electrons nor holes are injected), the charge carriers injected into the charge carrier injecting region will be rich in hot electrons. In this manner, electrons are accumulated in the charge carrier accumulating layer (SiN film etc.) (N. Matsukawa et al. 1995, IRPS). In this state, even if a voltage of 5V is applied to the gate, a voltage of 1V to the drain and no voltage to the source, current will scarcely flow. To be more specific, since the channel under the charge carrier accumulating layer on the source side becomes nonconductive during a read-out operation, this state is regarded as "write state". On the other hand, erase can be performed by two ways: using avalanche hot carriers (holes) and using the FN tunneling. When the avalanche hot holes are used, if a gate potential (Vg) is set to an appropriate value in the negative direction of the potential Va in the same manner as in the case of writing, as shown in FIG. 17, the charge carriers injected into the charge carrier injecting region will be rich in hot holes. In this way, holes are accumulated in the charge carrier accumulating layer (SiN film, etc.). In this state, since the channel under the charge carrier accumulating layer becomes conductive, current can flow during a read-out operation. Hence, this state can be regarded as "erase state". When the FN tunneling is used, if the gate potential is set to an appropriate value in the further negative direction (FN region in FIG. 17), the electric field will be generated stronger than that between the gate and source, thereby removing electrons from the carrier charge accumulating layer. During write/erase, if the gate potential of an unselected cell is set to a value (Va) at which neither electrons nor holes are injected, the data stored in the unselected cell will no longer disturbed.

Hereinbelow, we will explain the case where the charge carrier accumulating layer is provided on the drain side. Write/erase can be performed in the same manner as in the case where the charge carrier accumulating layer is provided on the source side. Note that if the source is connected to the ground instead of being open, a large amount of current can flow through the channel of a memory cell transistor, increasing the injection efficiencies of hot electrons and hot holes (S. Yamada et al., 1991, IEDM). There is another write method in which electrons are injected into the charge carrier accumulating layer by generating channel hot electrons on the drain side by permitting current to flow between the source and the drain.

Figure 9:
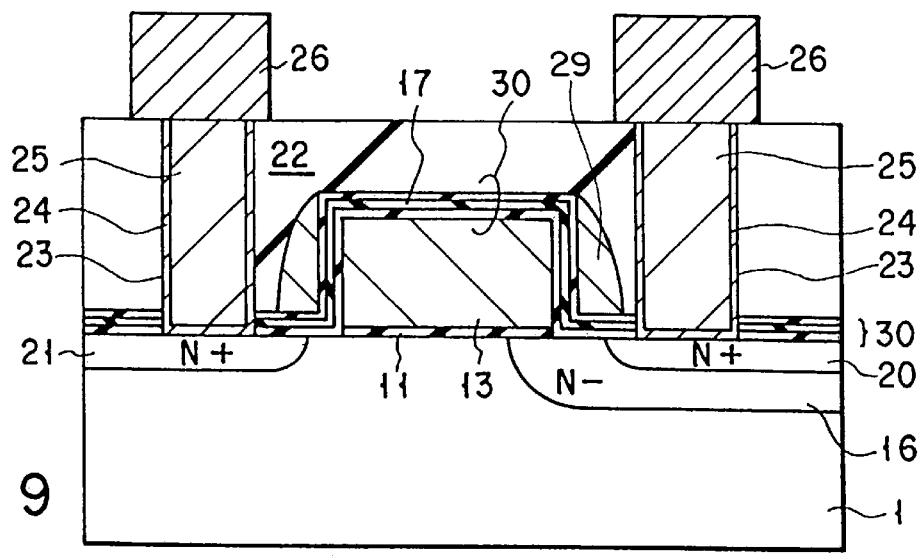
FIG. 9 is a cross sectional view of the nonvolatile memory cell according to a second embodiment of the present invention.

FIG. 9 is a cross sectional view of the nonvolatile memory cell according to a second embodiment of the present invention. On a semiconductor substrate 1, a gate electrode (control gate) 13 is formed. An insulating film 11 under the gate electrode 13 is constituted of a silicon oxide film. On the surface of the semiconductor substrate 1, source/drain regions are formed with the gate electrode 13 interposed therebetween. A diffusion layer 21 is a source in which an off-set region is provided. Diffusion layers 16 and 20 are lightly doped drain structure (LDD). On the channel region between an edge of the gate electrode 13 and the diffusion layer 21, a layered film 30 consisting of silicon oxide films and a SiN film 17 is provided. The layered film 30 is formed in such a way that the SiN film 17 is interposed between the silicon oxide films, covering the gate electrode 13. The SiN film 17 is a charge carrier accumulating layer. On the layered film 30, a polysilicon side wall electrode 29 is provided. Each of the diffusion layers 20 and 21 is formed so as to overlap with the neighbor of the lower edge portion of the side wall electrode 29. The diffusion layer 16 is provided so as to overlap with the neighbor of the lower edge portion of the gate electrode 13. On the substrate 1 and gate electrode 13, an insulating film 22 between layers is formed. Contact holes 23 are formed in the insulating film 22 between layers and respectively reach the diffusion layers 20 and 21. Each of the contact holes 23 is filled with a conductive material (contact plug) 25. A conductive barrier metal film (diffusion preventing film) 24 is provided on the bottom and to the inner side wall portions of the contact holes 23. The contact plugs 25 connect an upper layer, namely, Al wiring 26 to the source (diffusion layer 21) and to the drain (diffusion layer 20).

Figure 10:
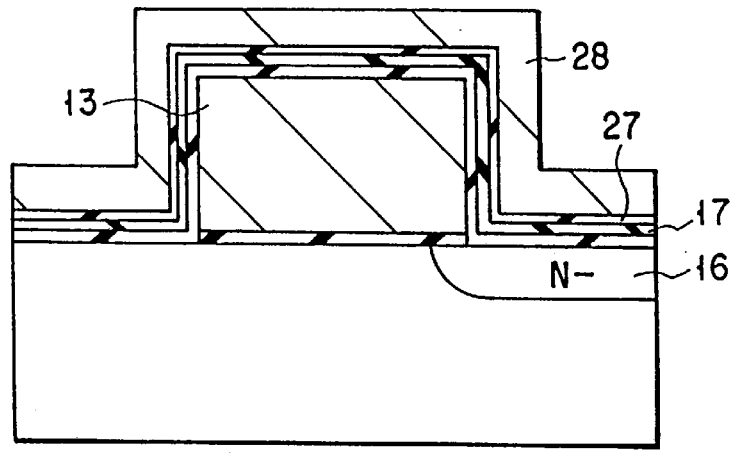
FIGS. 10 and 11 are cross sectional views showing the manufacturing steps of the nonvolatile memory cell according to a second embodiment of the present invention, in order of manufacturing.
Figure 11:
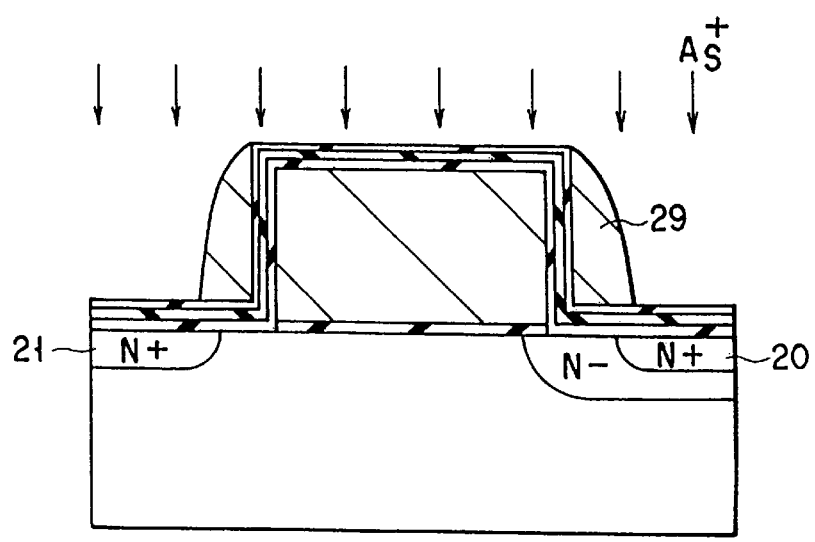

FIGS. 10 and 11 are cross sectional views showing the manufacturing steps of the nonvolatile memory cell according to a second embodiment of the present invention, in a stepwise manner. The steps from a gate patterning to the deposition of SiN film 17 are performed in the same manner as in the first embodiment. After the SiN film 17 is deposited, a silicon oxide film 27 is deposited, as shown in FIG. 10. On the silicon oxide film 27, polysilicon 28 is formed, for example, in a thickness of 20–200 nm. Thereafter, an N-type impurity such as arsenic or phosphorus is doped in a polysilicon 28 in an amount, for example, $2 \times 10^{20}$ to $4 \times 10^{20}$ cm$^{-3}$. In this manner, polysilicon 28 is metallized. The thickness of the oxide film 27 formed on the SiN film 17 is required to be larger than 2.5 nm to prevent outdiffusion of the charge carriers stored in the SiN film or to prevent holes from being injected from polysilicon side wall electrode 29, which is processed from polysilicon 28 later. In this manner, the ONO layered film (oxide film 14—SiN film 17—oxide film 27) is formed. The thickness of the ONO layered film should not exceed 30 nm.

Then, a polysilicon side wall electrode 29 is formed by etch back or the like, as shown in FIG. 11.

Subsequently, N-type impurities are introduced by a commonly-known technique, such as ion implantation, to form a diffusion layer 20 serving as a drain and a diffusion layer 21 serving as a source. The N-type diffusion layers 20 (drain) and 21 (source) formed by implanting ions in an amount, for example, $5 \times 10^{14}$–$10^{16}$ cm$^{-2}$, are relatively rich in N-type impurities. After the same procedures as those of the first embodiment are repeated, as shown in FIG. 9, memory cells are finally completed.

The memory cell of the second embodiment has a polysilicon electrode doped with impurities as the gate side wall. The polysilicon electrode controls the potential of the lower portion of the polysilicon electrode by the capacitive coupling with the gate electrode, thereby improving the efficiency and controllability of the charge carrier injection.

Figure 12A:
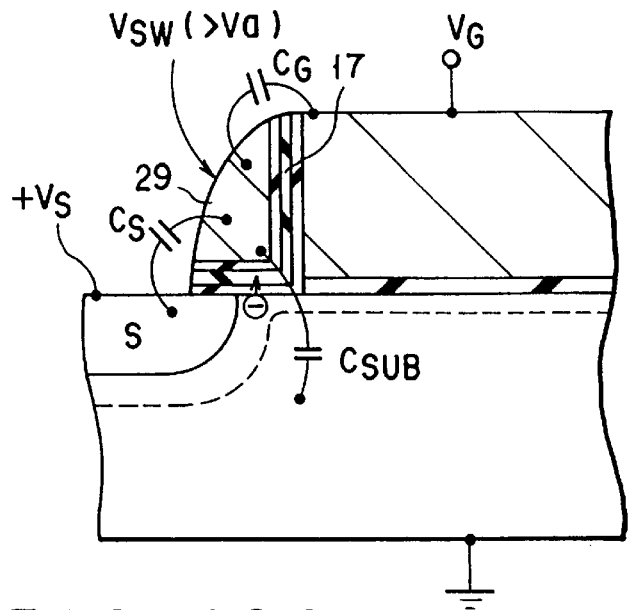
FIGS. 12A and 12B are cross sectional views for explaining the operations of the nonvolatile memory cell according to a second embodiment of the present invention.
Figure 12B:
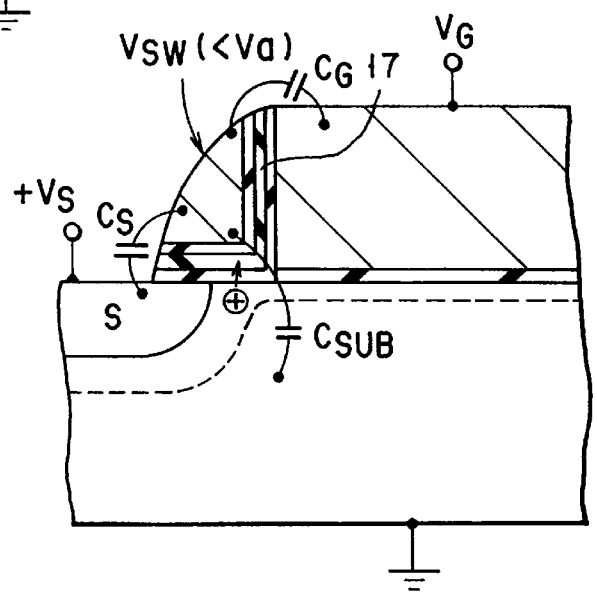

Referring now to FIGS. 12A and 12B, we will explain the operation of the nonvolatile memory cell according to a second embodiment of the present invention. In the case where the charge carrier injecting region is provided on the source side, write is executed in the same manner as in the first embodiment. The positive potential is applied to the source with the drain open. Since the polysilicon side wall electrode 29 is capacitively coupled with the gate, source and substrate, if a gate potential (Vg) is applied, the potential (Vsw) of the electrode 29 will be determined depending upon ratios in coupling capacitance of the polysilicon side wall electrode to the gate, source and substrate. In the case where the cell transistor structure of the second embodiment is used as a memory cell array, it is preferable that the height of the gate electrode of a cell transistor be 200 nm, the width of the polysilicon side wall electrode be 100 nm, the gate width of the cell transistor be 0.4 µm, and pitch in the direction of a word line be 0.8 µm. As a result, the capacitance between the polysilicon side wall electrode and the gate is about 80% based on the overall capacitance. In the case where a substrate is connected to the ground, the potential of the polysilicon side wall electrode will be about 80% of the gate potential. In this manner, the potential of the side wall polysilicon electrode can be controlled by the gate potential. If the potential (Vsw) of the polysilicon side wall is controlled to be set to an appropriate value in the positive direction of the potential (Va) by the gate potential, as shown in FIG. 17, the hot carriers generated in the end portion of the source diffusion layer, which will be injected into the charge carrier injecting region, will be rich in hot electrons.

In this mechanism, electrons are accumulated in the carrier charge accumulating layer (SiN film etc.). This state is regarded as "write state". It is presumable that the channel under the polysilicon side wall electrode becomes incidentally conductive during a read out operation by an increase of the potential Vsw. In this case, however, the current flow is extremely low, compared to the unwritten state, so that this state can be recognized as "write state". Furthermore, the potential (Vsw) of the polysilicon side wall can be controlled by the gate potential Vg also during erase, similarly during write. To be more specific, when the avalanche hot holes are used, if the gate potential (Vg) is controlled in such a way that the potential of the silicon side wall (Vsw) is set to an appropriate value in the negative direction of the potential (Va) shown in FIG. 17, the charge carriers injected into the charge carrier injecting region will be rich in hot holes. In this manner, the hot holes are accumulated in the charge carrier accumulating layer (SiN film etc.). Since the channel under the charge carrier accumulating layer becomes conductive in this state, current flows during a read-out operation. This state can be recognized as "erase state". When the FN tunneling is used, the gate electrode is controlled in such a way that the potential (Vsw) of the polysilicon side wall during the avalanche hot hole injection is set to a value which is in further negative direction (FN region). As a result, the electric field can be generated stronger than that between the gate and the source, removing electrons from the charge carrier accumulating layer. If the gate potential of unselected cells during the write/erase operation is controlled in such a way that the potential (Vsw) of the polysilicon side wall is set to the value (Va) shown in FIG. 17, data stored in an unselected cell will not be disturbed. In the case where the charge carrier accumulating layer is provided onto the drain side, the write/erase operation can be performed in the same manner as in the first embodiment.

Figure 13:
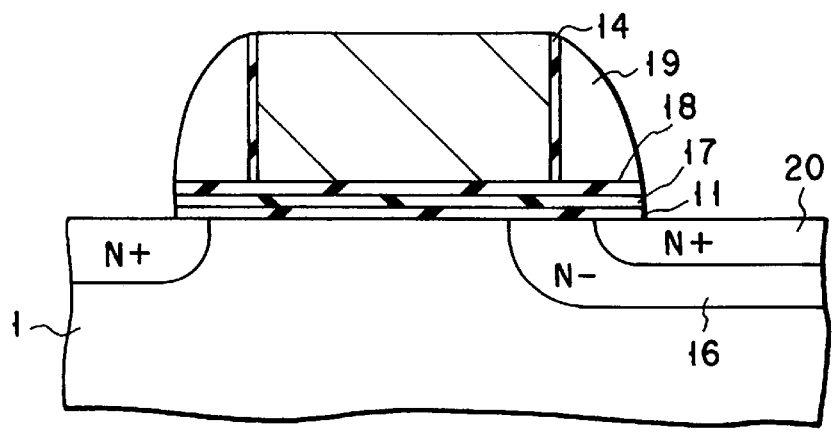
FIG. 13 is a cross sectional view of the nonvolatile memory cell according to a second embodiment of the present invention.

In the aforementioned embodiments, the memory cells are formed on a P-type substrate. The memory cells can be formed similarly to the case they are provided on the P-well on an N-type semiconductor substrate and the case where they are provided on the P-type region on an SOI (silicon on Insulator) substrate. In the memory cell according to the present invention, the charge carrier injecting region may be formed either on the source side or on the drain. In the aforementioned embodiments, the ONO insulating film is provided to and under the gate side wall. The ONO insulating film may be further used as a gate insulating film of the cell transistor to form the gate side wall 19, as shown in FIG. 13. The side wall 191 depicted in FIG. 13 is polysilicon. The polysilicon may be replaced with metallized polysilicon doped with an N-type impurity such as arsenic or phosphorus.

If the memory cells of the present invention as explained in the aforementioned embodiments are employed, select transistors will be no longer required, unlike the MONOS cells in which the write/erase operation is performed in the channel region. FIG. 14 is a circuit diagram characteristic in the present invention, showing a memory cell array, in which the charge carrier injecting region is provided on the source side. FIG. 15 is a circuit block diagram of the nonvolatile semiconductor memory device of the present invention.

Figure 16:
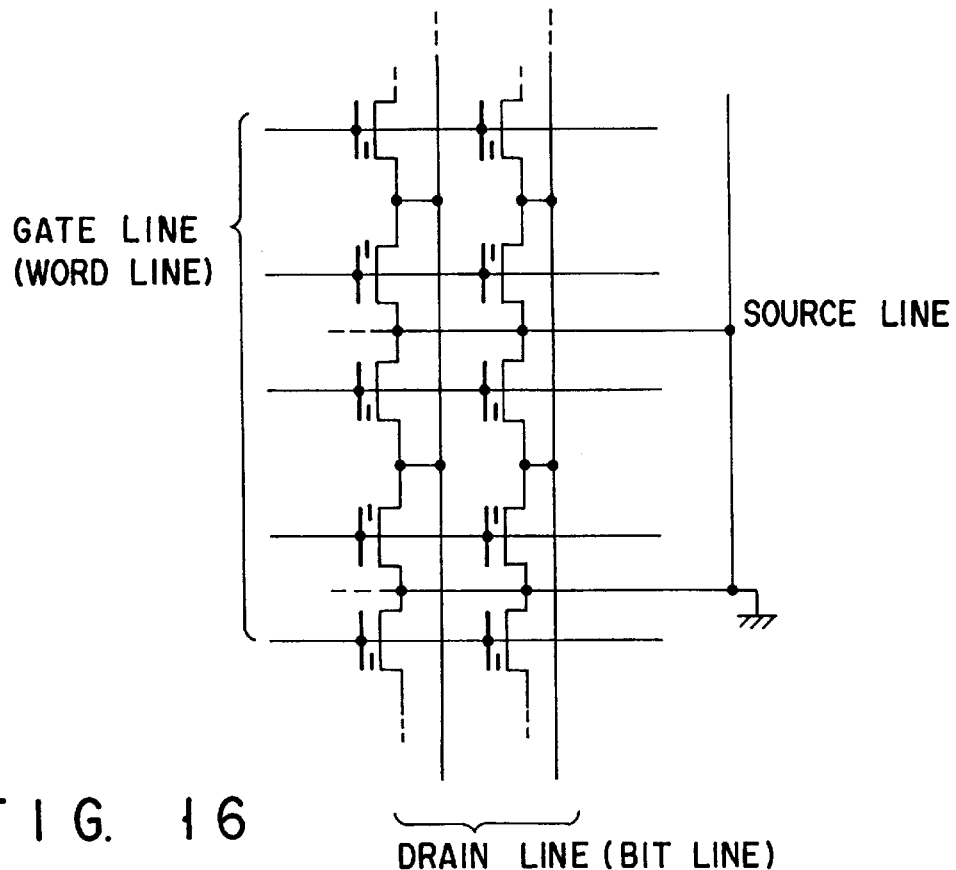
FIG. 16 is a circuit diagram showing another construction of a memory cell array of the nonvolatile semiconductor memory device according to the present invention.

FIG. 16 is a circuit diagram showing a different memory cell array from that of FIG. 14. In the memory cell array shown in FIG. 16, the charge carrier injecting region is provided on the drain side. In the memory cell thus arranged, write is performed by channel hot electrons and erase is carried out by drain avalanche hot holes.

In the memory cell of the present invention, there is an off-set region under the charge carrier injecting layer. The off-set region is linearly connected to a transistor, so that a select transistor is no longer required. Since the source/drain diffusion layers of the memory cell transistor can be formed very shallow, the gate length of the cell transistor will be decreased. Furthermore, as the charge carriers injected into the insulating film, use is made of hot carriers or avalanche hot carriers which are generated by band-to-band tunneling in the drain or the source acting as an injection electrode. When the charge carriers are injected in this manner, a relatively low energy is produced, compared to the case where hot carriers generated by the FN current are injected. Consequently, damage to the insulating film becomes low, improving the reliability of the memory cells. In addition, the data stored in an unselected cell aligned on the same bit line will be no longer a problem since it can be suppressed by controlling the gate potential of the unselected cell.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor substrate of a first conductivity type;
    first and second diffusion layers of a second conductivity type formed in said semiconductor substrate and spaced apart by a channel region;
    a gate electrode overlying a part of said channel region which extends to said first diffusion layer;
    a first insulating film between said gate electrode and said semiconductor substrate; and
    a second insulating film comprising at least two layers of different materials and overlying a part of said second diffusion layer and a part of said channel region which extends to said second diffusion layer, one of said at least two layers of said second insulating film being a charge carrier accumulating layer,
    wherein potentials are applied to said first and second diffusion regions such that avalanche hot carriers are generated which do not pass through said part of said channel region beneath said gate electrode, and either electrons or holes are injected into said charge accumulating layer of said second insulating film in accordance with a potential of said gate electrode.

2. The memory device according to claim 1, wherein said second insulating film has a thickness less than 30 nm.

3. The memory device according to claim 1, wherein said second insulating film constitutes a side wall of said gate electrode.

4. The memory device according to claim 1, wherein said second insulating film comprises a silicon oxide film having a thickness greater than 2 nm and less than 10 nm and a silicon nitride film having a thickness greater than 0.5 nm and less than 7 nm.

5. The memory device according to claim 1, wherein said first insulating film has the same construction as said second insulating film.

6. The memory device according to claim 1, wherein said second insulating film comprises at least one silicon oxide film having a thickness greater than 1 nm formed on said charge carrier accumulating layer.

7. The memory device according to claim 1, wherein said second insulating film comprises a silicon oxide film and a tantalum oxide film.

8. The memory device according to claim 1, wherein said second insulating film comprises a silicon oxide film and a strontium titanate film.

9. The memory device according to claim 1, wherein said second insulating film comprises a silicon oxide film and a barium strontium titanate film.

10. The memory device according to claim 1, wherein said first diffusion layer comprises an outer region lightly doped with impurities and an inner region heavily doped with impurities.

11. A nonvolatile semiconductor memory device comprising:
   a semiconductor substrate of a first conductivity type;
   first and second diffusion layers of a second conductivity type formed in said semiconductor substrate and spaced apart by a channel region;
   a gate electrode overlying a part of said channel region which extends to said first diffusion layer;
   a first insulating film between said gate electrode and said semiconductor substrate;
   a sidewall electrode overlying a part of said second diffusion layer and a part of said channel region which extends to said second diffusion layer, said sidewall electrode being capacitively coupled with said gate electrode; and
   a second insulating film comprising three layers formed between said sidewall electrode and said part of said second diffusion layer and between said sidewall electrode and said part of said channel region which extends to said second diffusion layer, one of said three layers of said second insulating film being a charge carrier accumulating layer,
   wherein potentials are applied to said first and second diffusion regions such that avalanche hot carriers are generated which do not pass through said part of said channel region beneath said gate electrode, and at least one type of charge carriers selected from the group consisting of electrons and holes are injected into said charge accumulating layer of said second insulating film in accordance with a potential of said gate electrode.

12. The memory device according to claim 11, wherein said second insulating film has a thickness less than 30 nm.

13. The memory device according to claim 11, wherein said second insulating film constitutes an insulating film between said side wall electrode and said gate electrode.

14. The memory device according to claim 11, wherein said second insulating film comprises a silicon oxide film having a thickness greater than 2 nm and less than 10 nm; a silicon nitride film having a thickness greater than 0.5 nm and less than 7 nm; and a silicon oxide film having a thickness greater than 2 nm and less than 10 nm.

15. The memory device according to claim 11, wherein said first insulating film has the same construction as said second insulating film.

16. The memory device according to claim 11, wherein said second insulating film comprises a silicon oxide film and a tantalum oxide film.

17. The memory device according to claim 11, wherein said second insulating film comprises a silicon oxide film and a strontium titanate film.

18. The memory device according to claim 11, wherein said second insulating film comprises a silicon oxide film and a barium strontium titanate film.

19. The memory device according to claim 11, wherein said first diffusion layer comprises an outer region lightly doped with impurities and an inner region heavily doped with impurities.

20. A nonvolatile semiconductor memory device comprising:
   a semiconductor substrate of a first conductivity type; and
   memory cells formed in said semiconductor substrate, each of said memory cells comprising
   first and second diffusion layers of a second conductivity type formed in said semiconductor substrate and spaced apart by a channel region;
   a gate electrode overlying a part of said channel region extending to said first diffusion layer;
   a first insulating film between said gate electrode and said semiconductor substrate; and
   a second insulating film comprising at least two layers of different materials and overlying a part of said second diffusion layer and a part of said channel region which extends to said second diffusion layer, one of said at least two layers of said second insulating film being a charge carrier accumulating layer,
   wherein
   a potential is applied to said second diffusion layer of a selected memory cell such that hot carriers are generated within a depletion region adjacent to said second diffusion layer and do not pass through said part of said channel region beneath said gate electrode, and at least one type of charge carriers selected from the group consisting of electrons and holes are injected from said depletion region into said charge carrier accumulating layer of said second insulating film in accordance with a potential of said gate electrode, whereas a potential applied to the gate electrode of an unselected memory cell which is influenced by the potential applied to said second diffusion layer of said selected memory cell is set to a value at which neither electrons nor holes are injected into a region adjacent to the second diffusion layer of said unselected memory cell.

21. A nonvolatile semiconductor memory device comprising:
   a semiconductor substrate of a first conductivity type; and
   memory cells formed in said semiconductor substrate, each of said memory cells comprising:
      first and second diffusion layers of a second conductivity type formed in said semiconductor substrate and spaced apart by a channel region;
      a gate electrode overlying a part of said channel region which extends to said first diffusion layer;
      a first insulating film between said gate electrode and said semiconductor substrate;
      a sidewall electrode overlying a part of said second diffusion layer and a part of said channel region which extends to said second diffusion layer, said sidewall electrode being capacitively coupled with said gate electrode; and
      a second insulating film comprising at least two layers of different materials and overlying a part of said second diffusion layer and a part of said channel region which extends to said second diffusion layer, one of said at least two layers of said second insulating film being a charge carrier accumulating layer,
   wherein
   a potential is applied to said second diffusion region of a selected memory cell such that hot carriers are generated within a depletion region adjacent to said second diffusion layer and do not pass through said part of said channel region beneath said gate electrode, and at least one type of carrier charges selected from the group consisting of electrons and holes are injected from said depletion region into said charge carrier accumulating layer of said second insulating film in accordance with a potential of said gate electrode, and, whereas a potential applied to the gate electrode of an unselected memory cell influenced by the potential applied to said second diffusion layer of said selected memory cell is set to a value at which neither electrons nor holes are injected into a region adjacent to said second diffusion layer of said unselected memory cell.

22. A nonvolatile semiconductor memory device comprising:

a semiconductor substrate of a first conductivity type;

first and second diffusion layers of a second conductivity type formed in said semiconductor substrate and spaced apart by a channel region;

a gate electrode overlying a part of said channel region which extends to said first diffusion layer;

a first insulating film between said gate electrode and said semiconductor substrate;

a sidewall electrode overlying a part of said second diffusion layer and a part of said channel region which extends to said second diffusion layer, a potential of said sidewall electrode being controlled only by capacitive coupling; and a second insulating film formed between said sidewall electrode and said part of said channel region which extends to said second diffusion layer, said second insulating film including a charge carrier accumulating layer.

23. The nonvolatile semiconductor memory device according to claim 22, wherein said second insulating film is further formed between said sidewall electrode and said gate electrode.

24. The nonvolatile semiconductor memory device according to claim 22, wherein said charge carrier accumulating layer of said second insulating film is one of the group consisting a silicon nitride layer; a tantalum oxide layer; a strontium oxide layer; a barium strontium titanate layer; and a lead zirconate titanate layer.

25. The nonvolatile semiconductor memory device according to claim 22, wherein said second insulating film is an oxide-nitride-oxide (ONO) film.

26. A nonvolatile semiconductor memory device comprising:

a semiconductor substrate of a first conductivity type;

first and second diffusion layers of a second conductivity type formed in said semiconductor substrate and spaced apart by a channel region;

a control gate electrode overlying a part of said channel region which extends to said first diffusion layer;

a first insulating film between said control gate electrode and said semiconductor substrate; and a second insulating film comprising at least a first layer of a first material and a second layer of a second different material, said first layer formed on a sidewall of said control gate electrode and further formed to overly a part of said second diffusion layer and a part of said channel region which extends to said second diffusion layer, said second layer of said second insulating film being a charge carrier accumulating layer.

27. The nonvolatile semiconductor memory device according to claim 26, wherein said charge carrier accumulating layer of said second insulating film is one of the group consisting a silicon nitride layer; a tantalum oxide layer; a strontium oxide layer; a barium strontium titanate layer; and a lead zirconate titanate layer.

28. The nonvolatile semiconductor memory device according to claim 26, wherein said second insulating film is an oxide-nitride-oxide (ONO) film.

* * * * *